United States Patent
Lee et al.

(10) Patent No.: US 8,054,626 B2
(45) Date of Patent: Nov. 8, 2011

(54) DISPLAY APPARATUS HAVING A COOLING DEVICE

(75) Inventors: You-seop Lee, Yongin-si (KR); Jong-seok Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/721,661

(22) Filed: Mar. 11, 2010

(65) Prior Publication Data
US 2011/0080708 A1 Apr. 7, 2011

(30) Foreign Application Priority Data
Oct. 6, 2009 (KR) .................. 10-2009-0094681

(51) Int. Cl.
*H05K 7/20* (2006.01)
(52) U.S. Cl. .............. 361/694; 361/679.48; 361/679.49; 361/695; 361/231; 165/109.1; 165/121; 165/124; 165/185; 313/582; 417/49
(58) Field of Classification Search ............. 361/679.46, 361/679.48, 679.5, 690–697, 704–719, 825, 361/831, 31, 373; 165/802, 803, 121, 122, 165/126, 104.33, 185; 257/718–727; 313/11, 313/13, 17, 22–25, 35, 36, 44–47, 582; 349/60–65, 349/58, 20, 161; 345/84, 87
See application file for complete search history.

(56) References Cited

U.S. PATENT DOCUMENTS

| | | | | |
|---|---|---|---|---|
| 5,053,912 A | * | 10/1991 | Loreth et al. ................... | 361/230 |
| 5,090,482 A | * | 2/1992 | Baron et al. ..................... | 169/46 |
| 7,190,587 B2 | * | 3/2007 | Kim et al. ....................... | 361/704 |
| 7,661,468 B2 | * | 2/2010 | Schlitz ............................ | 165/121 |
| 2003/0203245 A1 | * | 10/2003 | Dessiatoun et al. ............. | 429/8 |
| 2006/0104087 A1 | * | 5/2006 | Leu ................................. | 362/600 |
| 2009/0080157 A1 | * | 3/2009 | Varadarajan et al. ......... | 361/697 |

FOREIGN PATENT DOCUMENTS

| | | | |
|---|---|---|---|
| JP | 10-241556 | | 9/1998 |
| JP | 02007183436 A | * | 7/2007 |
| JP | 02007293105 A | * | 11/2007 |
| WO | WO 94/12282 | * | 6/1994 |

* cited by examiner

*Primary Examiner* — Michail V Datskovskiy
(74) *Attorney, Agent, or Firm* — Stanzione & Kim, LLP

(57) ABSTRACT

A display apparatus having a front substrate that is a display panel, a rear substrate disposed at a predetermined distance apart from the front substrate and facing the front substrate, the rear substrate comprising a back light unit, and a cooling device to remove heat generated by the rear substrate. The cooling device includes an actuator disposed between the front substrate and the rear substrate, the actuator to generate an ion wind using a voltage, a transparent electrode installed to face the actuator and which is grounded, a plurality of supports to support ends of the actuator, and a high-voltage power source to apply a voltage to the actuator.

21 Claims, 4 Drawing Sheets

DISPLAY APPARATUS HAVING A COOLING DEVICE

CROSS-REFERENCE TO RELATED APPLICATIONS

This application claims priority under 35 U.S.C. §119(a) from Korean Patent Application No. 10-2009-0094681, filed on Oct. 6, 2009, in the Korean Intellectual Property Office, the disclosure of which is incorporated herein in its entirety by reference.

BACKGROUND

1. Field of the Invention

The present general inventive concept relates to a display apparatus having a cooling device that removes heat to cool the display apparatus.

2. Description of the Related Art

Most display apparatuses that have recently been developed are flat display panels, such as liquid crystal displays (LCDs). Flat display panels may be manufactured to be thinner and have a wider screen than general display apparatuses that use cathode rays, which require space in a thickness direction.

Much heat is generated in such a flat panel since the display apparatus operates by accelerating electrons onto a fluorescent surface to generate light. Thus, a cooling device is needed in order to remove heat generated in the display apparatus. Conventional cooling devices may employ a natural convection method or a forced convection method that ventilates an area by using a fan. However, the natural convection methods have low cooling efficiencies, and the forced convection methods generate noise and vibrations due to fan use. Accordingly, there is a demand to develop a cooling device that overcomes the problems of conventional cooling devices and has high cooling efficiency.

SUMMARY OF THE INVENTION

The present general inventive concept provides a display apparatus that does not generate noise or vibrations and that removes heat generated locally and excessively in a display panel, thereby preventing the display panel from being damaged due to thermal stress.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by a display apparatus including a front substrate that is a display panel, a rear substrate disposed at a predetermined distance apart from the front substrate and facing the front substrate, the rear substrate having a back light unit, and a cooling device to remove heat generated by the rear substrate, wherein the cooling device includes an actuator disposed between the front substrate and the rear substrate, the actuator to generate an ion wind using a voltage, a transparent electrode installed facing the actuator and which is grounded, a plurality of supports to support ends of the actuator, and a high-voltage power source to apply a voltage to the actuator.

The actuator may include at least one wire.

The at least one wire may have a diameter of 10 to 200 μm.

The transparent electrode may be disposed to entirely cover a front surface of the rear substrate.

The transparent electrode may be disposed at an upper part of the rear substrate.

The plurality of supports may be formed of a non-conducting material, and apply tension to the actuator.

The display apparatus may further include a catalytic unit being disposed in an inactive region formed along edges of the rear substrate and having a predetermined width, the catalytic unit being formed of a catalyst to dissolve ozone generated as a by-product by the actuator.

The foregoing and/or other aspects and utilities of the general inventive concept may also be achieved by a display apparatus including a front substrate that is a display panel, a rear substrate disposed at a predetermined distance apart from the front substrate and facing the front substrate, the rear substrate having a back light unit, and a cooling device to cool the front substrate, wherein the cooling device includes an actuator disposed between the front substrate and the rear substrate, the actuator to generate an ion wind using a voltage, a transparent electrode to which the ion wind is supplied and which is grounded, a plurality of supports to support ends of the actuator, and a high-voltage power source to apply a voltage to the actuator.

The foregoing and/or other aspects and utilities of the general inventive concept may also be achieved by a display apparatus including a display panel, a back light unit disposed facing the display panel in order to irradiate a beam onto the display panel, and a cooling device to generate an ion wind between the display panel and the back light unit, wherein the cooling device includes at least one wire installed between the display panel and the back light unit, a transparent electrode disposed on a surface of the back light unit or on a surface of the display panel, which face each other, a plurality of supports to support ends of the at least one wire, and a high-voltage power source to apply a voltage to the at least one wire.

The transparent electrode may be grounded to generate a corona discharge between the at least one wire and the transparent electrode.

The transparent electrode may be disposed to entirely cover a front surface of the back light unit.

The transparent electrode may be disposed to entirely cover a rear surface of the display panel.

The foregoing and/or other aspects and utilities of the general inventive concept may also be achieved by a cooling device used in a display apparatus having a front and back panel, the front panel being a display and the back panel being a lighting unit, the cooling device including an actuator provided between the front and back panel to dissipate heat generated by the back panel.

The cooling device may include a transparent electrode and a power source that together with the actuator forms a closed circuit when the transparent electrode is grounded.

The actuator may include wires such that an electric field is generated around the wires when the transparent electrode is grounded and a voltage is applied to the wires.

A corona discharge region is formed around the wires if an electric potential of the electric field is greater than a predetermined level.

A corona discharge is formed in the corona discharge region and causes an ion wind within the display apparatus that is capable of flowing in a predetermined direction according to a polarity of the wires.

The foregoing and/or other aspects and utilities of the general inventive concept may also be achieved by a display apparatus having a front and back panel including a cooling device disposed in a space between the front and back panel, to generate a flow of ion wind along a first path to remove heat within the space, and an inlet and outlet formed at opposite sides of the display apparatus to allow air to flow from the inlet towards the outlet along a second path that intersects the first path, and which removes heat within the space.

The foregoing and/or other aspects and utilities of the general inventive concept may also be achieved by a method of removing heat generated in a display apparatus having a front and back panel, including generating an ion wind that flows within the display apparatus in a first direction to remove heat generated by the back panel, and generating an air flow that flows within the display apparatus in a second direction that intersects the ion wind flowing in the first direction to remove heat generated by the back panel.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
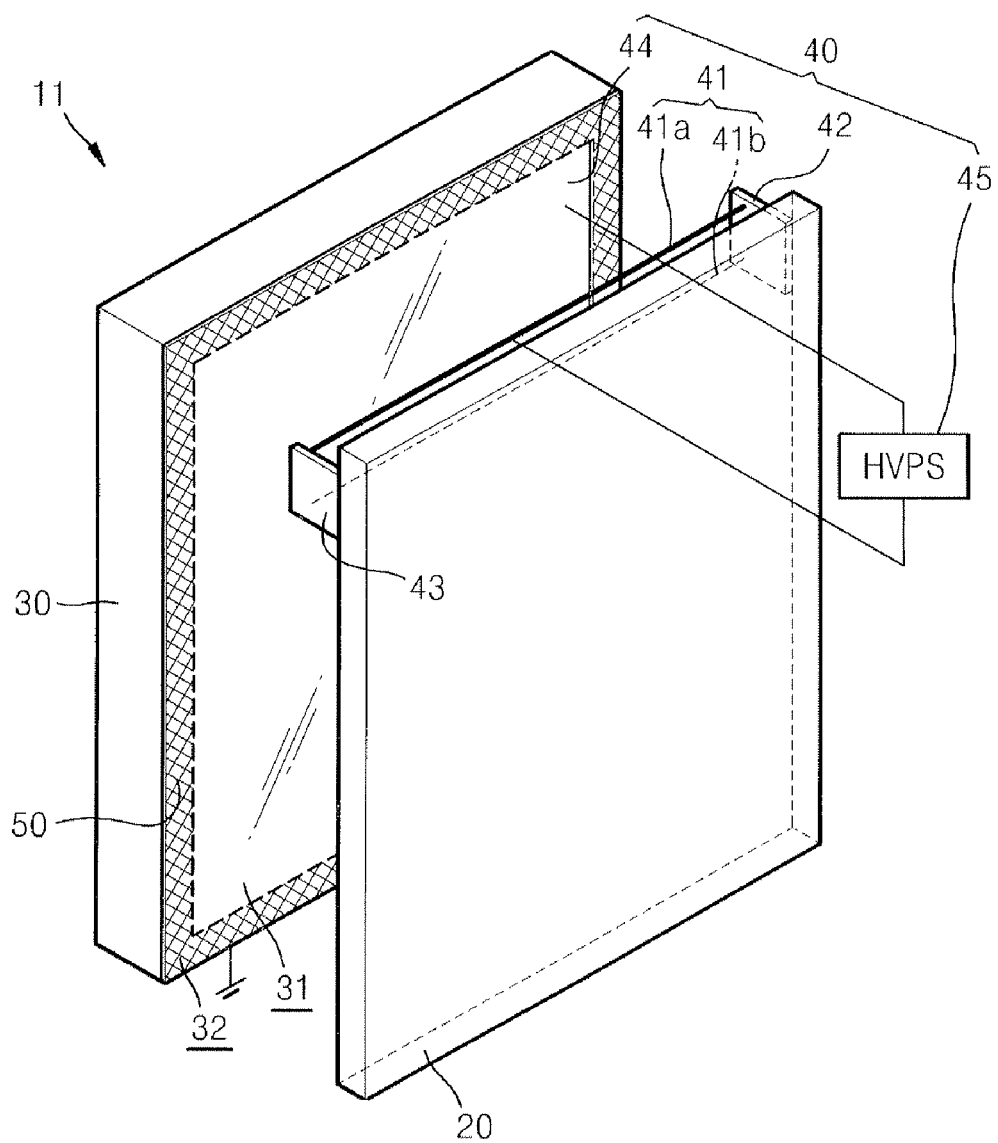
FIG. 1 is an exploded perspective view of a display apparatus having a cooling device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
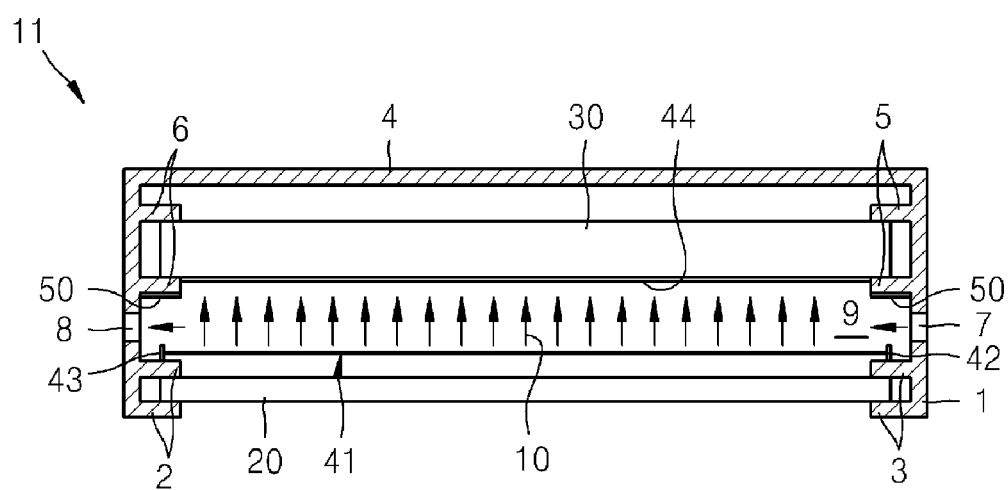
FIG. 2 is a plane view of the display apparatus illustrated in FIG. 1.

FIG. 1 is an exploded perspective view of a display apparatus 11 having a cooling device 40 according to an embodiment of the present general inventive concept. FIG. 2 is a plane view of the display apparatus 11 illustrated in FIG. 1.

Referring to FIGS. 1 and 2, the display apparatus 11 includes a front substrate 20, a rear substrate 30, and the cooling device 40. The front substrate 20 is a display panel, such as a liquid crystal display (LCD). The rear substrate 30 is disposed at a predetermined distance apart from the front substrate 20, i.e., by a space 9 having a predetermined width, while facing the front substrate 20, and includes a back light unit (BLU) (not shown). The cooling device 40 is installed in the space 9, and removes heat generated by the rear substrate 30 by using an ion wind. The front substrate 20 may be fixed on a front frame 1 via a plurality of supports 2 and 3, and the rear substrate 30 may be fixed on a rear frame 4 via a plurality of supports 5 and 6. The structures of the supports 2, 3, 5, and 6 are illustrated in FIG. 2, but are not limited thereto, and may be constructed in various ways.

The cooling device 40 includes an actuator 41, a plurality of supports 42 and 43, a transparent electrode 44, and a high-voltage power source 45. The actuator 41, the supports 42 and 43, the transparent electrode 44, and the high-voltage power source 45, together, form a closed circuit.

The actuator 41 generates an ion wind using a voltage applied from the high-voltage power source 45 and may include a pair of wires 41a and 41b as corona discharge emitters. The wires 41a and 41b may be disposed at a rear surface of the front substrate 20, one positioned above the other, and may be spaced apart at a predetermined interval. The wires 41a and 41b are disposed across an active region 31 of the rear substrate 30, which allows light to pass through, and thus, may be constructed to have a diameter between 10 μm and 200 μm in order to not obstruct the path of light.

If the wires 41a and 41b have a thickness less than 10 μm, the reliability thereof may be degraded and manufacturing costs thereof may increase. If the wires 41a and 41b have a thickness greater than 200 μm, the wires 41a and 41b may obstruct the path of light and may prevent formation of an electric field sufficient for corona discharge.

Although the wires 41a and 41b are formed in the path of light, the wires 41a and 41b having a diameter between 10 μm and 200 μm cannot be seen on the front substrate 20 due to diffusion of light. Although FIG. 1 illustrates two wires, i.e., the wires 41a and 41b, the present general inventive concept is not limited thereto and a plurality of wires may be arranged in an array to increase the intensity of an ion wind when needed. The wires 41a and 41b may be formed to have ends that are round, but the present general inventive concept is not limited thereto, and the wires 41a and 41b may be formed to have triangular or saw tooth shaped ends.

The wires 41a and 41b are formed to face an upper part of the rear substrate 30 because the temperature of the upper part of the rear substrate 30 is much higher than that of a lower part of the rear substrate 30 when the display apparatus 11 operates. If differences between the temperatures of the upper and lower parts of the rear substrate 30 are large, the rear substrate 30 is likely to be damaged due to thermal stress caused by unequal temperatures. Accordingly, in order to prevent such a phenomenon, the upper part of the rear substrate 30 is cooled using an ion wind, thereby equalizing the distribution of temperature of the rear surface 30.

The supports 42 and 43 not only support ends of the wires 41a and 41b but also apply tension thereto. The supports 42 and 43 may be installed at the rear surface of the front substrate 20 as illustrated in FIG. 1 and may be attached to the supports 2 and 3 as illustrated in FIG. 2. The supports 42 and 43 may be formed of a non-conducting material, such as plastic. Methods of attaching the supports 42 and 43 to the rear surface of the front substrate 20 or to the supports 2 and 3 are not limited to the description as illustrated in FIGS. 1 and 2 and various other methods may be used.

The transparent electrode 44 may be formed of a transparent conducting material, e.g., an indium tin oxide (ITO), in order to not obstruct the path of light emitted from the rear substrate 30, to minimize an optical loss, and to form an electric field. As illustrated in FIG. 1, the transparent electrode 44 may be disposed to entirely cover a front surface of the rear substrate 30 having the active region 31 through which light passes and an inactive region 32 that does not allow light to pass through. The transparent electrode 44 may be grounded in order to form a closed circuit with the high-voltage power source 45.

The high-voltage power source 45 is connected to the actuator 41 and the transparent electrode 44, and applies a high voltage to the actuator 41. When a high voltage of several kilo volts (KV) is applied to the actuator 41 from the high-voltage power source 45, a positive corona discharge may occur in the actuator 41. A negative corona discharge may occur by inverting the polarity of the voltage.

Operations of the cooling device 40 to generate an ion wind will now be described.

Referring to FIGS. 1 and 2, if the transparent electrode 44 is grounded and a high voltage is applied to the wires 41a and 41b, then high-intensity electric fields are generated around the wires 41a and 41b. If an electric potential of the high intensity electric fields are greater than a predetermined level, then a corona discharge region is formed around the wires 41a and 41b. In the corona discharge region, electrons are accelerated to high speeds and collide with air molecules, separating the air molecules into positive ions and electrons. Then, a corona discharge, i.e., a thick cloud of positive ions and electrons in the corona discharge region, is formed around the wires 41a and 41b. In this case, if the polarity of the wires 41a and 41b is negative, then the positive ions in the corona discharge region move toward and are absorbed by the wires 41a and 41b and the electrons are moved far away from the wires 41a and 41b, thereby generating an ion wind 10. The ion wind 10 moves toward the transparent electrode 44. The ion wind 10 acts as forced convection to dissipate heat generated by the rear substrate 30. If the polarity of the wires 41a and 41b is positive, the positive ions move in the opposite way, thus also generating an ion wind.

Referring to FIG. 2, the space 9 having the predetermined width is formed between the front substrate 20 and the rear substrate 30, and an inlet 7 and an outlet 8 may be formed in order to have good ventilation, between which the space 9 is interposed. Thus, natural convection may occur, in which external air flows into the space 9 via the inlet 7 and flows out via the outlet 8. As described above, not only forced convection but also natural convection may occur due to the ion wind 10, thereby effectively removing heat generated in the display apparatus 11. Although not shown in the drawings, a filter may be installed in each of the inlet 7 and the outlet 8 in order to prevent foreign substances, such as dust, from entering the space 9.

Ozone $O_3$ is generated as a by-product during a corona discharge regardless of whether the polarity of the corona discharge is negative or positive. The concentration of ozone $O_3$ when a negative corona discharge occurs is higher than when a positive corona discharge occurs. Thus, a positive corona discharge may be preferred to the negative corona discharge but the present general inventive concept is not limited thereto.

A catalyst, such as a manganese (Mn) oxide, a palladium (Pd) compound, or a metallic Pd, may be used in order to effectively dissolve ozone $O_3$ generated as a by-product during a negative or positive corona discharge. A catalytic unit 50 may be formed on the inactive region 32 of the rear substrate 30 as illustrated in FIG. 1 or may be formed on sides of the supports 5 and 6 of the rear frame 4 as illustrated in FIG. 2.

Figure 3:
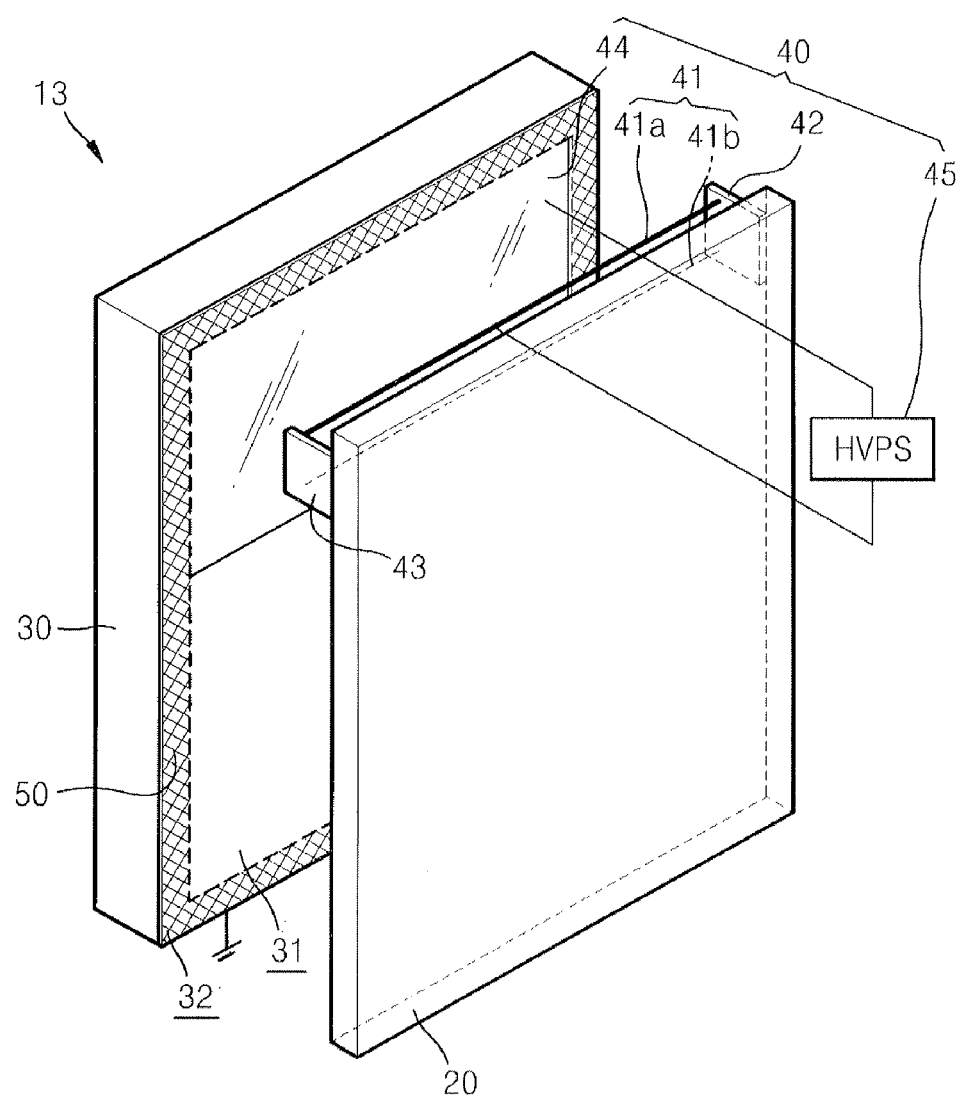
FIG. 3 is an exploded perspective view of a display apparatus having a cooling device according to another embodiment of the present general inventive concept.

FIG. 3 is an exploded perspective view of a display apparatus 13 having a cooling device 40 according to another embodiment of the present general inventive concept. Referring to FIG. 3, the structure of the display apparatus 13 is basically the same as that of the display apparatus 11 illustrated in FIG. 1 except that the transparent electrode 44 is formed to cover only an upper part of the rear substrate 30. The transparent electrode 44 is formed according to a deposition method and may thus be formed to cover only the upper part of the rear substrate 30 in consideration of process efficiency.

Figure 4:
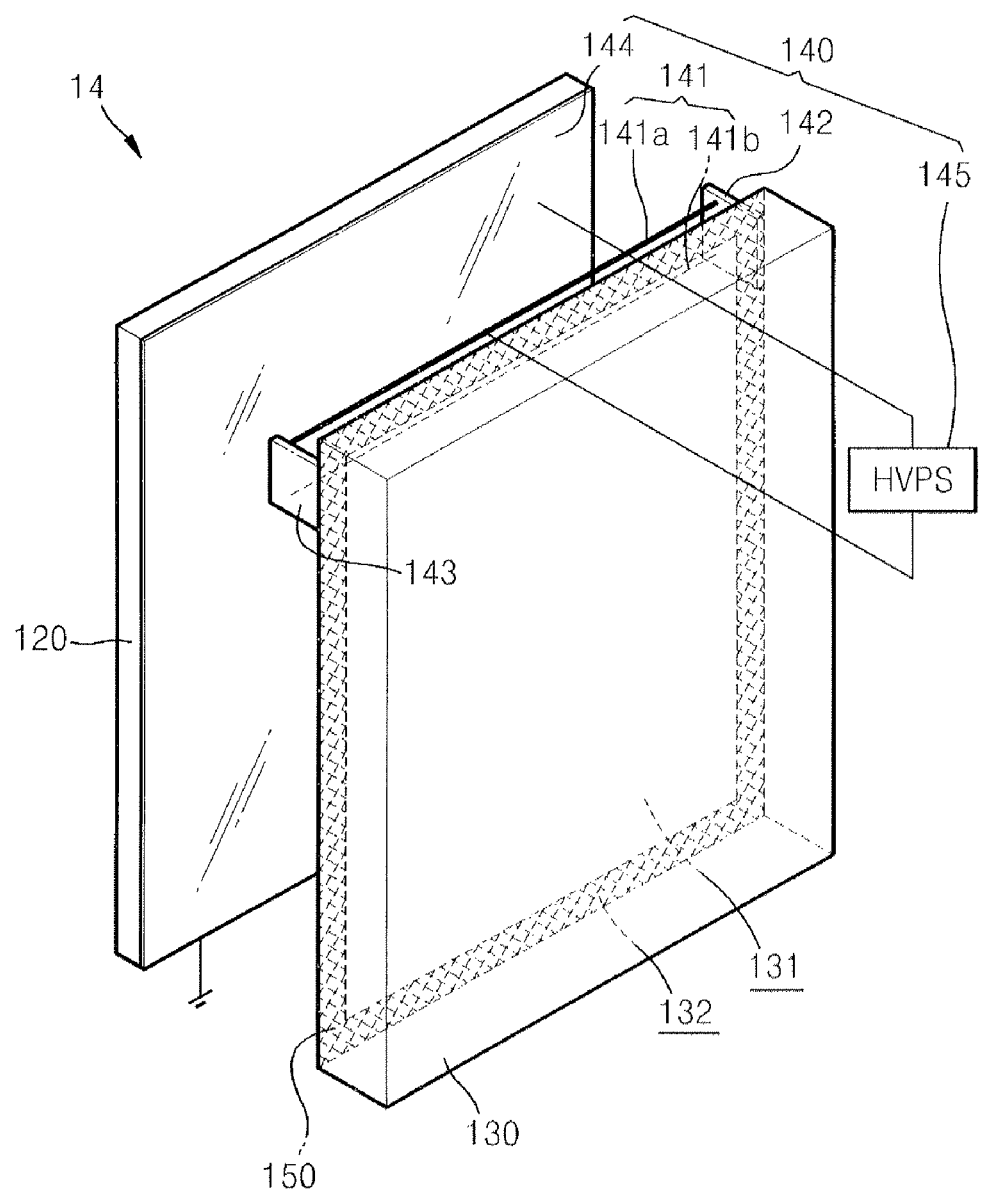
FIG. 4 is an exploded perspective view of a display apparatus having a cooling device according to another embodiment of the present general inventive concept.

FIG. 4 is an exploded perspective view of a display apparatus 14 having a cooling device 140 according to another embodiment of the present general inventive concept. Referring to FIG. 4, the display apparatus 14 includes a front substrate 120, a rear substrate 130, and the cooling device 140. The front substrate 120 is an LCD panel, and the rear substrate 130 is disposed apart at a predetermined distance (the space 9 of FIG. 2) from the front substrate 120 and includes a back light unit (BLU).

The cooling device 140 includes an actuator 141, a transparent electrode 144, and a high-voltage power source 145. The actuator 141 includes a pair of wires 141a and 141b having ends which are supported by a plurality of supports 142 and 143 and that are fixed on an upper part of the rear substrate 130. The transparent electrode 144 is formed to entirely cover a rear surface of the front substrate 120 and is grounded. The high-voltage power source 145 is connected to the transparent electrode 144 and the actuator 141 and applies a high voltage to the actuator 141. A catalytic unit 150 is formed on an inactive region 132 of the rear substrate 130 in order to remove ozone $O_3$ that is generated as a byproduct when an ion wind is generated. The inactive region 132 is formed to cover all side surfaces of an active region 131, preventing light from passing through the side surfaces.

Unlike as illustrated in FIGS. 1 to 3, in the cooling device 140 illustrated in FIG. 4, the actuator 141 is disposed at an upper part of the rear substrate 130 and the transparent electrode 144 is disposed at a rear surface of the front substrate 120 in order to cool the front substrate 120. This structure is designed to cool the front substrate 120, that is, an LCD, heated by solar energy when the display apparatus 14 is installed outdoor.

The operating principle of the cooling device 140 is the same as that of the cooling device 40 illustrated in FIG. 1.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A display apparatus comprising:
   a front substrate that is a display panel;
   a rear substrate disposed a predetermined distance apart from the front substrate and facing the front substrate, the rear substrate comprising a back light unit; and
   a cooling device to remove heat generated by the rear substrate;
   wherein the cooling device comprises:
      an actuator disposed between the front substrate and the rear substrate, the actuator to generate an ion wind using a voltage;
      a transparent electrode installed to face the actuator and which is grounded;
      a plurality of supports to support ends of the actuator; and
      a high-voltage power source to apply a voltage to the actuator.

2. The display apparatus of claim 1, wherein the actuator comprises at least one wire.

3. The display apparatus of claim 2, wherein the at least one wire has a diameter of 10 to 200 μm.

4. The display apparatus of claim 1, wherein the transparent electrode is disposed to entirely cover a front surface of the rear substrate.

5. The display apparatus of claim 1, wherein the transparent electrode is disposed at an upper part of the rear substrate.

6. The display apparatus of claim 1, wherein the plurality of supports are formed of a non-conducting material, and apply tension to the actuator.

7. The display apparatus of claim 1, further comprising a catalytic unit being disposed in an inactive region formed along edges of the rear substrate and having a predetermined width, the catalytic unit being formed of a catalyst to dissolve ozone generated as a by-product by the actuator.

8. A display apparatus comprising:
a front substrate that is a display panel;
a rear substrate disposed a predetermined distance apart from the front substrate and facing the front substrate, the rear substrate comprising a back light unit; and
a cooling device to cool the front substrate;
wherein the cooling device comprises:
an actuator disposed between the front substrate and the rear substrate, the actuator to generate an ion wind using a voltage;
a transparent electrode to which the ion wind is supplied and which is grounded;
a plurality of supports to support ends of the actuator; and
a high-voltage power source to apply a voltage to the actuator.

9. The display apparatus of claim 8, wherein the transparent electrode is disposed to entirely cover a rear surface of the front substrate.

10. The display apparatus of claim 8, wherein the actuator comprises at least one wire.

11. The display apparatus of claim 10, wherein the at least one wire has a diameter of 10 to 200 μm.

12. The display apparatus of claim 8, wherein the plurality of supports are formed of a non-conducting material, and apply tension to the actuator.

13. The display apparatus of claim 8, further comprising a catalytic unit being disposed in an inactive region formed along edges of the rear substrate and having a predetermined width, the catalytic unit being formed of a catalyst to dissolve ozone generated as a by-product by the actuator.

14. A display apparatus comprising:
a display panel;
a back light unit disposed to face the display panel in order to irradiate a beam onto the display panel; and
a cooling device to generate an ion wind between the display panel and the back light unit,
wherein the cooling device comprises:
at least one wire installed between the display panel and the back light unit;
a transparent electrode disposed on a surface of the back light unit or on a surface of the display panel, which face each other;
a plurality of supports to support ends of the at least one wire; and
a high-voltage power source to apply a voltage to the at least one wire.

15. The display apparatus of claim 14, wherein the transparent electrode is grounded to generate a corona discharge between the at least one wire and the transparent electrode.

16. The display apparatus of claim 14, wherein the transparent electrode is disposed to entirely cover a front surface of the back light unit.

17. The display apparatus of claim 14, wherein the transparent electrode is disposed to entirely cover a rear surface of the display panel.

18. A cooling device used in a display apparatus having a front and back panel, the front panel being a display and the back panel being a lighting unit, the cooling device comprising:
an actuator provided between the front and back panel to dissipate heat generated by the back panel.

19. The cooling device of claim 18, further comprising:
a transparent electrode and a power source that together with the actuator forms a closed circuit when the transparent electrode is grounded.

20. The cooling device of claim 19, wherein the actuator includes wires such that an electric field is generated around the wires when the transparent electrode is grounded and a voltage is applied to the wires.

21. A method of removing heat generated in a display apparatus having a front and back panel, comprising:
generating an ion wind that flows within the display apparatus in a first direction to remove heat generated by the back panel; and
generating an air flow that flows within the display apparatus in a second direction that intersects the ion wind flowing in the first direction to remove heat generated by the back panel.

* * * * *